United States Patent
Han et al.

(10) Patent No.: US 11,518,706 B2
(45) Date of Patent: Dec. 6, 2022

(54) SILVER COATED GLASS FRIT, METHOD FOR PREPARING SAME, AND SILVER PASTE COMPOISITION USING SILVER COATED GLASS FRIT FOR SOLAR CELL

(71) Applicant: LUVANTIX ADM CO., LTD., Daejeon (KR)

(72) Inventors: Sungsu Han, Kingsport, TN (US); Jin A Kim, Seoul (KR); Bum Suk Kim, Songji-myeon (KR); Chang Hyun Rho, Incheon (KR); Young Jun Song, Yeosu-si (KR)

(73) Assignee: TERA METAL CO., LTD., Anyang-si (KR)

( * ) Notice: Subject to any disclaimer, the term of this patent is extended or adjusted under 35 U.S.C. 154(b) by 1118 days.

(21) Appl. No.: 16/074,754

(22) PCT Filed: Jan. 23, 2017

(86) PCT No.: PCT/KR2017/000782
§ 371 (c)(1),
(2) Date: Aug. 1, 2018

(87) PCT Pub. No.: WO2017/135619
PCT Pub. Date: Aug. 10, 2017

(65) Prior Publication Data
US 2021/0179483 A1 Jun. 17, 2021

(30) Foreign Application Priority Data

Feb. 2, 2016 (KR) .......................... 10-2016-0012680
Jan. 12, 2017 (KR) .......................... 10-2017-0005612

(51) Int. Cl.
*C03C 8/18* (2006.01)
*H01L 31/0224* (2006.01)
(Continued)

(52) U.S. Cl.
CPC .................. *C03C 8/18* (2013.01); *C03C 1/02* (2013.01); *C03C 4/14* (2013.01); *C03C 8/04* (2013.01);
(Continued)

(58) Field of Classification Search
CPC ........................ H01L 31/022425; B82Y 30/00
See application file for complete search history.

(56) References Cited

FOREIGN PATENT DOCUMENTS

| CN | 105895191 A | * | 8/2016 | ............. B82Y 30/00 |
| JP | 2014164994 A | * | 9/2014 | ............... H01B 1/22 |

(Continued)

OTHER PUBLICATIONS

PCT International Search Report, PCT/KR2017/000782, dated Apr. 25, 2017, 3 Pages.

*Primary Examiner* — Khanh T Nguyen
(74) *Attorney, Agent, or Firm* — Fenwick & West LLP (57) ABSTRACT

The present invention relates to a silver coated glass frit used in a paste composition for forming a solar cell electrode, a method for preparing the same, and a silver paste composition using a silver coated glass frit for a solar cell. More specifically, the present invention relates to: a method for preparing a silver-coated glass frit wherein a silver coated glass frit, in which silver (Ag) is coated on a surface of the glass frit, is prepared through a reduction reaction occurring by adding, to a first solution containing silver nitrate ($AgNO_3$) mixed with a glass frit and an amine, a second solution containing a reductant, and during the preparation process, a silver (Ag) coating layer is more uniformly formed on the surface of the glass frit by controlling the acidity of the first solution and the reaction temperature in the reduction reaction, thereby achieving an improved specific surface area; a silver-coated glass frit prepared by the method; and a silver paste composition for a solar cell (Continued)

wherein the composition is prepared by using the sliver-coated glass frit, and thus has significantly improved sintering characteristics and electrical conductivity.

12 Claims, 4 Drawing Sheets

(51) Int. Cl.
    *C03C 1/02*     (2006.01)
    *C03C 4/14*     (2006.01)
    *C03C 8/04*     (2006.01)
    *C03C 8/10*     (2006.01)

(52) U.S. Cl.
    CPC ........ *C03C 8/10* (2013.01); *H01L 31/022425* (2013.01)

(56) References Cited

FOREIGN PATENT DOCUMENTS

| | | | |
|---|---|---|---|
| KR | 10-0978636 B1 | 8/2010 | |
| KR | 10-1157478 B1 | 6/2012 | |
| KR | 20120099587 A * | 9/2012 | ............. C03C 12/00 |
| KR | 10-2013-0120325 A | 11/2013 | |
| KR | 10-2014-0092744 A | 7/2014 | |
| KR | 10-2014-0119249 A | 10/2014 | |
| KR | 10-2014-0127051 A | 11/2014 | |
| KR | 10-1515785 B1 | 5/2015 | |

\* cited by examiner

SILVER COATED GLASS FRIT, METHOD FOR PREPARING SAME, AND SILVER PASTE COMPOISITION USING SILVER COATED GLASS FRIT FOR SOLAR CELL

TECHNICAL FIELD

The present invention relates to a silver-coated glass frit for use in a paste composition for forming a solar cell electrode, a preparation method thereof, and a silver paste composition for a solar cell, which comprises the silver-coated glass frit. More specifically, the present invention relates to a method for preparing a silver-coated glass frit having a reduced specific surface area, the method comprising preparing a silver-coated glass frit, which comprises silver (Ag) coated on the surface of glass frit, through a reduction reaction of adding a second solution containing a reducing agent to a first solution containing a mixture of silver nitrate (AgNO3), glass frit and amine, wherein the acidity (pH) of the first solution and the reaction temperature of the reduction reaction are controlled in the preparation process, thereby forming a more uniform silver (Ag) coating layer on the surface of glass frit, and to a silver-coated glass frit prepared by the method and to a paste composition for a solar cell, which is prepared using the silver-coated glass frit, and thus has dramatically improved sintering characteristics and electrical conductivity.

BACKGROUND ART

In conventional silicon solar cells, an emitter layer composed an n-type silicon semiconductor, an anti-reflective layer and a front electrode are formed on the light-receiving side of a silicon wafer, and a substrate composed of a p-type silicon semiconductor, and a rear electrode are formed on the opposite side.

The emitter layer composed of the n-type silicon semiconductor forms a p-n junction with the substrate composed of the p-type silicon semiconductor. Because the electron mobility in the p-layer is better, the n-layer is usually formed on the p-type silicon semiconductor in order to form a p-n junction, but may be vice versa.

The electrodes on both sides of the silicon wafer are formed by printing a paste comprising conductive powder, glass frit and an organic vehicle by a screen printing method or the like, followed by drying and calcining. For the front electrode, silver (Ag) having excellent electrical conductivity is mainly used as conductive powder.

Namely, in the case of the front electrode, in order to maximize the light absorption area, a fine printed pattern should be formed in the printing process, and in order to ensure sufficiently low resistance per a small print area, a relatively large printing thickness should be achieved.

To satisfy these requirements, high electrical conductivity is required. To minimize the resistance of the electrode after calcining, silver (Ag) is mainly used.

In general silver pastes containing silver (Ag) as conductive powder, the content of silver (Ag) powder in the silver paste is 80% or more in order to maintain the high electrical conductivity of the electrode. In this case, there is a problem in that the production cost of a solar cell electrode increases because the content of expensive silver (Ag) is 80% or more. Silver (Ag) powder is not completely sintered under high-temperature and high-speed sintering conditions, the electrical conductivity decreases rather than increases, due to weak bonding between silver (Ag) particles. In addition, uniform contact between the electrode and the emitter layer is not achieved, and thus the contact resistance between the electrode and the emitter increases, resulting in a reduction in the efficiency of the solar cell.

To overcome these problems, a conventional silver paste contains glass frit together with silver (Ag) powder. This glass frit is melted in a calcining process and etches an anti-reflective layer formed on an emitter layer, thereby the ohmic contact between the electrode and the emitter layer. In addition, it facilitates melting of silver (Ag) particles to improve the sintering characteristics of the silver particles, thereby improving the electrical conductivity of the electrode and brining the electrode into uniform contact with the emitter layer.

However, despite these advantages, when the content of the glass frit is increased, a problem arises in that the glass frit perforates the emitter layer of the solar cell during the calcining process, and thus the effect of the cell is lost. For this reason, in a conventional silver paste, the content of the glass frit is limited to about 5% or less. This glass frit content of about 5% or less has limited improvement on the sintering characteristics of silver (Ag) powder. In addition, the content of silver (Ag) powder still accounts for 80% or more of the silver paste, thus reducing the efficiency of production of the solar cell electrode.

Accordingly, in recent years, there has been developed either a glass frit capable of improving the sintering characteristics and contact characteristics of a silver paste even when it is used in small amounts, or a silver paste that may have improved sintering characteristics and contact characteristics by comprising a metal oxide together with a glass frit. Examples thereof include a silver paste composition disclosed in Korean Patent Application Publication No. 2015-0131937 (entitled "Silver paste composition and solar cell fabricated using the same").

The conventional silver paste composition as described above comprises silver (Ag) powder, glass frit, an organic vehicle and a porous metal oxide. Here, the glass frit comprising a combination of selected components improves the contact property between the front electrode and the substrate by improving the etching ability of the silver paste composition, and the metal oxide that is crystallized at lower temperatures promotes the crystallization of silver (Ag), thereby improving the efficiency of the solar cell.

However, in the case of the above-described silver paste composition disclosed in Korean Patent Application Publication No. 2015-0131937, the sintering characteristics and contact characteristics of the silver paste are somewhat improved even by a relatively small amount of the glass frit. However, since the content of silver (Ag) in the silver paste composition is still 80% or more, problems arise in that the production cost of a solar cell increases and improvement in the sintering characteristics of silver (Ag) powder is limited.

DISCLOSURE

Technical Problem

The present invention has been made in order to solve the above-described problems, and an object of the present invention to provide a method for preparing a silver-coated glass frit having a reduced specific surface area, the method comprising preparing a silver-coated glass frit, which comprises silver (Ag) coated on the surface of glass frit, through a reduction reaction of adding a second solution containing a reducing agent to a first solution containing a mixture of silver nitrate (AgNO3), glass frit and amine, wherein the acidity (pH) of the first solution and the reaction temperature of the reduction reaction are controlled in the preparation process, thereby forming a more uniform silver (Ag) coating layer on the surface of glass frit, and when the silver-coated glass frit is used in a silver paste composition for a solar cell, the content of silver in the composition may be reduced, the sintering characteristics of the composition may be improved, thus increasing the efficiency of the solar cell, and the composition may be effectively applied for fine line-width printing in a paste printing process, and also to provide a silver-coated glass frit prepared by the method and a paste composition for a solar cell, which is prepared using the silver-coated glass frit.

Technical Solution

To achieve the above object, the present invention provides a method for preparing a silver-coated glass frit comprising a uniform silver (Ag) coating layer formed on the surface of glass frit, the method comprising: adding amine and glass frit to a silver nitrate (AgNO3) solution, followed by stirring, thereby preparing a first solution; dissolving a reducing agent in distilled water, thereby producing a second solution; and adding the second solution to the first solution at a predetermined rate while stirring. The present invention also provides a silver paste composition for a solar cell, which is prepared by mixing the prepared silver-coated glass frit with silver (Ag) powder, glass frit and an organic vehicle.

Advantageous Effects

The present invention provides a silver-coated glass frit, a preparation method thereof, and a silver paste composition for a solar cell, which comprises the silver-coated glass frit. According to the present invention, a silver-coated glass frit comprising a uniform silver (Ag) coating layer formed thereon is prepared by a simple process using a wet reduction process. When the silver-coated glass frit prepared as described above is applied to a silver paste composition, glass frit having a low glass transition temperature facilitates melting of silver (Ag) coated on the surface of the glass frit in a calcining process performed for a short time, thereby improving the sintering characteristics of the silver (Ag) particles. At the same time, the glass frit melt in the calcining process is surrounded by silver (Ag) coated on the surface of the glass frit and does not flow out during the calcining process, thereby preventing a solar cell silicon wafer from being damaged by an increase in the content of glass frit.

In addition, a silver paste composition for a solar cell, which comprises the silver-coated glass frit, solves the problem that the emitter layer of the solar cell is perforated by glass frit and thus the cell loses its function, while the composition has an increased content of glass frit. Thus, the content of silver (Ag) in the silver paste composition can be reduced, thus reducing the production cost of the solar cell. In addition, even when the composition contains a small amount of silver (Ag), it can minimize the resistance of the electrode due to its improved sintering characteristics, and makes it possible to bring the electrode into uniform contact with the emitter layer, thereby reducing the contact resistance between the electrode and the emitter layer, resulting in improvement in the efficiency of the solar cell electrode.

In addition, according to the present invention, the silver-coated glass frit comprising silver (Ag) coated on the surface of glass frit is prepared by adding a solution containing a reducing agent to a solution comprising a mixture of silver nitrate (AgNO3), glass frit and amine. In the preparation process, the pH of the solution and the reaction temperature are adjusted to control the rate of the reduction reaction, thereby forming a uniform silver (Ag) coating layer on the surface of the glass grit. Thus, the prepared silver-coated glass frit may have a reduced specific surface area. This silver paste composition comprising the silver-coated glass frit has advantages in that the viscosity and flowability in a calcining process are easily controlled and it is effectively applied for fine line-width printing in a paste printing process employing a screen printing method during solar cell fabrication.

BEST FOR INVENTION

Hereinafter, embodiments of the present invention will be described in detail, but the scope of the present invention is not limited to these embodiments.

A method for preparing a silver-coated glass frit according to the present invention comprises adding a second solution containing a reducing agent to a first solution comprising a mixture of silver nitrate (AgNO3), glass frit and amine, thereby preparing a silver coated glass frit comprising silver (Ag) coated on the surface of glass frit having a low glass transition temperature. Thus, according to the method of the present invention, a silver-coated glass frit comprising a uniform silver (Ag) coating layer formed thereon may be prepared through a simple process.

In the silver-coated glass frit prepared as described above, the glass frit having a low glass transition temperature can facilitate melting of silver (Ag) coated on the surface of the glass frit during a calcining process, thereby improving the sintering characteristics of the silver (Ag) particles. In addition, the glass frit melted during the calcining process is surrounded by the coated silver (Ag) and can facilitate melting and sintering of the silver (Ag). Thus, the silver-coated glass frit can overcome the problem that the emitter layer of the solar cell is perforated by glass frit during the calcining process and thus the cell loses its function.

In addition, when a silver paste composition for a solar cell is prepared using the above-described silver-coated glass frit, the total content of glass frit in the composition is increased, and at the same time, the composition overcomes the problem that the emitter layer of the solar cell is perforated by glass frit during the calcining process and thus the cell loses its function. Furthermore, the content of silver (Ag) in the silver paste composition may be reduced, thereby reducing the production cost of the solar cell. In addition, even when the composition contains a small amount of silver (Ag), it can minimize the resistance of the electrode due to its improved sintering properties. Furthermore, the composition makes it possible to bring the electrode into uniform contact with the emitter layer, thereby reducing the contact resistance between the electrode and the emitter layer, resulting in an increase in the efficiency of the solar cell electrode.

Meanwhile, in the case of the silver-coated glass frit as described above, if the silver (Ag) coating layer coated on the surface of glass frit is not uniform, the specific surface area of the silver-coated glass frit will increase. If a silver paste composition is prepared using this silver-coated glass frit, the viscosity and flowability thereof will be difficult to control, making it difficult to print a fine line-width (30 μm to 50 μm) in a paste printing process employing a screen printing method during solar cell fabrication. For this reason, it is required to form a uniform silver (Ag) coating layer on the surface of glass frit, thereby reducing the specific surface area.

Accordingly, a method for preparing a silver-coated glass frit according to the present invention, a silver coated glass frit comprising silver (Ag) coated on the surface of glass frit is prepared through a reduction reaction of adding a second solution containing a reducing agent to a first solution comprising a mixture of silver nitrate (AgNO3), glass frit and amine, wherein the pH of the first solution and the reaction temperature of the reduction reaction are controlled in the preparation process, thereby forming a uniform silver (Ag) coating layer on the surface of glass frit, indicating that the prepared silver-coated glass frit may have a reduced specific surface area.

Namely, the method for preparing the silver-coated glass frit according to the present invention can prepare silver-coated glass frit powder having a reduced specific surface area close to that of common pure silver (Ag) powder which is applied to solar cell fabrication. This silver-coated glass frit powder may be used as a substitute for a portion of silver (Ag) powder in a silver paste composition. This silver paste composition according to the present invention has advantages in that the viscosity and flowability thereof are easily controlled, and thus it may also be effectively applied for printing of a fine line-width (30 μm to 50 μm) in a paste printing process using a screen printing method during solar cell fabrication.

Hereinafter, the above-described method for preparing the silver-coated glass frit, and the silver paste composition for the solar cell, which comprises the silver-coated glass frit, will be described in further detail.

(1) Method for Preparing Silver-Coated Glass Frit

The method for preparing the silver-coated glass frit comprises:

Step (a) adding glass frit and amine to a silver nitrate solution (made by dissolving silver nitrate (AgNO3) in distilled water), followed by stirring, thereby preparing a first solution.

In the process of adding glass frit and amine to the silver nitrite solution and stirring, the stirring is performed at 200 to 700 rpm at a temperature of 30° C. to 95° C.

Here, the amine that is added to the silver nitrate solution is added in order to form a complex salt for facilitating induction of a reduction reaction.

Accordingly, in preparation of the first solution, the contents of silver nitrate, amine and glass frit in the first solution act as an important factor in determining the thickness of a silver coating layer coated on the surface of glass frit. Preferably, the mass ratio between glass frit and silver coated on the glass frit is 1:0.5 to 1:1.5.

To this end, preferably, the concentration of silver nitrate in the first solution is 1M (molarity, mol/l) to 4M, the concentration of amine in the first solution is 0.1M to 1M, and the concentration of glass frit in the first solution is 0.5M to 2M.

Namely, as the content of silver (Ag) coated on glass frit decreases, the thickness of the silver (Ag) coating layer excessively decreases, and thus glass frit melted in a calcining process can penetrate through the silver (Ag) coating layer and flow out of the silver (Ag) coating layer, and for this reason, the emitter layer of the solar cell can be perforated by the glass frit. As the silver (Ag) content of the silver-coated glass frit increases, the thickness of the silver (Ag) coating layer excessively increases, making it difficult to improve the sintering characteristics of the silver (Ag) particles. In addition, it adversely affect the object of the present invention, which is to reduce the production cost of the solar cell by using the silver-coated glass frit as a substitute for a portion of silver (Ag) powder in a silver paste composition to reduce the silver (Ag) content of the silver paste composition.

In the process of preparing the first solution, the amount of amine added to the first solution is adjusted to control the pH of the solution, so that silver salt can be uniformly formed on the surface of glass frit.

To this end, in the process of adjusting the pH of the first solution, the amount of amine added to the first solution is adjusted, thereby controlling the pH of the first solution to a pH of 10-11, preferably a pH of 10.3-10.7.

In addition, a dispersing agent may further be added to the first solution. When this dispersing agent is added to the silver nitrate solution and stirred together with glass frit and amine, there is an advantage in that the dispersing agent effectively and uniformly disperses glass frit powder, thereby forming a more uniform particle size distribution.

Namely, when the dispersion of glass frit powder is not properly achieved, glass frit powders having a silver salt formed therein in a complex salt formation process agglomerate, and thus the particle size distribution of the silver-coated glass frit may be non-uniform compared to that of glass frit before coating. If a silver paste composition for a solar cell is prepared using silver-coated frit powder having a non-uniform particle size distribution, the paste is not properly printed on a substrate during fine pattern printing in a paste printing process based on a screen printing method during solar cell fabrication, thereby causing failure of the pattern. Due to this problem, the dispersing agent is preferably added in order to maintain a uniform particle size distribution.

As the dispersing agent used in the first solution, an anionic or nonionic aqueous wetting dispersing agent may preferably be used.

Moreover, if the surface roughness of silver (Ag) coated on the surface of glass frit is high, the specific surface area of the silver (Ag) coating layer will increase and will be significantly larger than that of silver (Ag) powder which is used in a silver paste for a solar cell. If such silver-coated glass frit powder is used as a substitute for a portion of silver (Ag) powder in the preparation of a silver paste composition, a problem may arise in that it is difficult to control the viscosity and flowability of the paste, making it difficult to print a fine line-width in a paste printing process employing a screen printing method during solar cell fabrication.

Namely, conventional silver (Ag) powder which is used in a silver paste for a solar cell has a specific surface area of about 1 m2/g as measured by the BET (Brunauer-Emmett-Teller equation) measurement method. In the case of a conventional silver paste for a solar cell which has a silver (Ag) content of 90% or more, it is easy to control the viscosity and flowability of the paste, making it possible to print a fine line-width in a paste printing process employing on a screen printing method during solar cell fabrication.

After the first solution is prepared through step (a) above, step (b) is performed in which a reducing agent for precipitating silver (Ag) from silver nitrate is dissolved in distilled water, thereby preparing a second solution.

Here, the concentration of the reducing agent in the second solution is preferably 0.02M to 1M.

The reducing agent that is used in the second solution may be any reducing agent that is used in a conventional silver precipitation reaction, and examples thereof include hydrazine, hydroquinone, ascorbic acid, aldehyde and glucose, which may be used alone or as a mixture of two or more thereof.

Next, step (c) is performed in which the second solution is added to the first solution, followed by stirring.

In step (c), the second solution is added to the first solution at a flow rate of 5 to 50 g/min at a temperature of 5° C. to 20° C. while stirring is performed at 200 to 700 rpm.

In this process, the reason why the first solution and the second solution are stirred at a low temperature of 5° C. to 20° C. is to adjust the reduction reaction rate to a low level so that silver (Ag) coating may be formed more uniformly on the surface of glass surface and the surface roughness of the silver (Ag) coating layer may be controlled more uniformly, thereby further reducing the specific surface area (BET surface area (m2/g)).

Namely, in the process in which the second solution containing the reducing agent is added to the first solution subjected to first stirring and the mixture solution is additionally stirred, the additional stirring is performed at a temperature lower than that of the first stirring. For this reason, a silver coating layer is coated more uniformly on glass frit while the reaction of silver (Ag) by the reducing agent progresses slower, and thus the surface roughness of the silver (Ag) coating layer may be controlled more uniformly.

Next, step (d) is performed in which the silver-coated glass frit powder produced in step (c) is collected, washed, and dried, thereby obtaining silver-coated glass frit powder which is to be used in silver paste.

When a silver paste composition for a solar cell is prepared using the silver-coated glass frit according to the present invention, the following advantages are obtained. Even in a calcining process which is performed for a relatively short time, glass frit having a low glass transition temperature can facilitate melting of silver (Ag) coated on the surface of the glass frit, thereby improving the sintering characteristics of the silver (Ag) particles. In addition, the contact of the silver particles with a substrate can be improved, thereby reducing the contact resistance between the substrate and the electrode, resulting in significant improvement in the electrical properties of the solar cell. Furthermore, the amount of silver (Ag) used in the silver paste composition can be reduced, and thus the production cost of a solar cell electrode can be reduced, thereby increasing the efficiency of production of the solar cell electrode.

Hereinafter, the components that are used in preparation of the silver-coated glass frit will be described.

(i) Reducing Agent

A reducing agent is used to precipitate silver (Ag) particles from silver nitrate (AgNO3) and to coat the silver particles on glass frit. Examples of the reducing agent include hydrazine, hydroquinone, ascorbic acid, aldehyde, glucose and the like, which may be used alone or as a mixture of two or more thereof.

(ii) Amine

Amine is used to facilitate induction of a reduction reaction and is added to a silver nitrate solution so that silver (Ag) particles can be attached to the surface of glass frit, thereby forming a uniform silver (Ag) coating layer. Examples of the amine include most amine-based compounds in which the hydrogen atom of ammonia is substituted with hydrocarbon radical R, including aliphatic primary amines, aliphatic secondary amines, aliphatic tertiary amines, aliphatic unsaturated amines, aliphatic cyclic amines, aromatic amines and the like.

(iii) Glass Frit

Glass frit that may be used in the present invention is not limited and may be any glass frit used in the art. It preferably has a mean particle diameter (D50) of 0.3 to 1.3 μm. For example, it may include lead oxide and/or bismuth oxide. Specifically, the glass frit may comprise any one or a mixture of two or more selected from among zinc oxide-silicon oxide (ZnO—SiO2), zinc oxide-boron oxide-silicon oxide (ZnO—B2O3-SiO2), zinc oxide-boron oxide-silicon oxide-aluminum oxide (ZnO—B2O2-SiO2-Al2O3), bismuth oxide (Bi2O3), bismuth oxide-silicon oxide (Bi2O3-SiO2), bismuth oxide-boron oxide-silicon oxide (Bi2O3-B2O3-SiO2), bismuth oxide-boron oxide-silicon oxide-aluminum oxide (Bi2O3-B2O3-SiO2-Al$_2$O$_3$), bismuth oxide-zinc oxide-boron oxide-silicon oxide (Bi2O3-ZnO—B2O3-SiO2), bismuth oxide-zinc oxide-boron oxide-silicon oxide-aluminum oxide (Bi2O3-ZnO—B2O3-SiO2-Al$_2$O$_3$), lead oxide (PbO), lead oxide-tellurium oxide (PbO—TeO2), lead oxide-tellurium oxide-silicon oxide (PbO—TeO2-SiO2), lead oxide-oxide tellurium-lithium oxide (PbO—TeO2-Li2O), bismuth oxide-tellurium oxide (Bi2O3-TeO2), bismuth oxide-tellurium oxide-silicon oxide (Bi2O3-TeO2-SiO2), bismuth oxide-tellurium oxide-lithium oxide (Bi2O3-TeO2-Li2O), tellurium oxide (TeO2), and oxide tellurium-zinc oxide (TeO2-ZnO) glass frits.

(iv) Dispersing Agent

A dispersing agent is used to facilitate dispersion of glass frit powders. As this dispersing agent, an anionic or nonionic aqueous wetting dispersing agent is preferably used, and examples thereof include sodium polyacrylate, a saponification product of a maleic anhydride-styrene (or olefin) copolymer, a sodium alkyl naphthalene-formalin condensate, sodium lignin sulfonate, polyethylene glycol phenyl ether, phenyl ether, higher alkyl polyethylene glycol, ether dialkyl succinate, a sorbitan aliphatic ethylene oxide adduct, and the like.

In particular, an aqueous dispersing agent based on a copolymer having a group compatible with a pigment is preferably used, and examples thereof include BYK 184, BYK182, BYK142 and the like.

Meanwhile, the silver-coated glass frit prepared according to the above-described method may additionally be coated with a fatty acid in order to further reduce the specific surface area thereof.

In this regard, a method of coating the fatty acid on the silver-coated glass frit may comprise:

(e) stirring oleic acid, monoethanolamine and ethanol, thereby preparing a third solution; (f) adding the silver-coated glass frit obtained in step (d) to distilled water, followed by stirring, thereby preparing a fourth solution; (g) adding a predetermined amount of the third solution to the fourth solution, followed by stirring; and (h) collecting, washing and drying the silver-coated glass frit resulting from step (g), thereby obtaining silver-coated glass powder coated with fatty acid.

In step (g) of adding the third solution to the fourth solution, the third solution is added in an amount of about 5-20 wt % based on the weight of the silver-coated glass frit contained in the fourth solution.

When fatty acid coating of the silver-coated glass frit is performed, the specific surface area of the glass frit can be reduced to 1 m2/g or less. In the case of a silver paste composition prepared using the silver-coated glass frit coated with the fatty acid as described above, it is easy to control the viscosity and flowability of the composition, making it possible to effectively perform fine line-width (30 µm to 50 µm) printing in a paste printing process employing a screen printing method during solar cell fabrication.

The silver-coated glass frit prepared according to the present invention may have a mean particle diameter (D50) of 1.0 to 1.5 µm; the mean thickness (D50) of the silver (Ag) coating layer formed on the glass frit in the silver-coated glass frit may be 0.2 to 0.7 µm; and the content of the silver (Ag) coated on the glass frit in the silver-coated glass frit may be 30 to 60 wt %, preferably 40 to 50 wt %. In addition, the silver-coated glass frit may have a specific surface area of 0.8 m2/g to 0.9 m2/g.

(2) Experimental Example for Preparation of Silver-Coated Glass Frit

In Experimental Examples 1 to 4, in order to examine the specific surface area of the silver-coated glass frit as a function of the pH of the first solution, silver-coated glass frits were prepared by controlling the pH of the first solution depending on the amount of amine added while maintaining the contents of components other than amine at constant levels. As the amine, diallylamine (CH2=CHCH2)2NH), a kind of aliphatic unsaturated amine, was used, and as the reducing agent, ascorbic acid was used, and as the glass frit, lead oxide-silicon oxide-bismuth oxide (PbO—SiO2-B2O3) was used.

In addition, in Experimental Examples 1 to 4, the reaction temperature in first stirring and second stirring was maintained at a temperature of 30° C. to 95° C.

Table 1 below shows the components and their ratios used in Experimental Examples 1 to 4, and Table 2 below shows the results of measuring the specific surface areas of the silver-coated glass frits, prepared in Experimental Examples 1 to 4, by the BET (Brunauer-Emmett-Teller equation) measurement method.

FIGS. 1 to 4 show SEM (scanning electron microscope) images of the silver-coated glass frits prepared in Experimental Examples 1 to 4. Specifically, FIGS. 1 to 4 are images showing the shapes of the silver-coated glass frits prepared in Experimental Examples 1 to 4, respectively.

TABLE 1

Comparison of components and their ratios between Experimental Examples 1 to 4

| | First solution | | | | | Second solution | | | |
|---|---|---|---|---|---|---|---|---|---|
| | Silver nitrate ($AgNO_3$) | Distilled water ($H_2O$) | Amine | Glass frit | pH | Distilled water ($H_2O$) | Reducing agent (ascorbic acid) | First reaction temperature | Second reaction temperature |
| Experimental Example 1 | 200 g | 500 g | 20 g | 25 g PbO—$SiO_2$—$B_2O_3$ | 9.2 | 700 g | 20 g | 30° C. to 95° C. | 30° C. to 95° C. |
| Experimental Example 2 | 200 g | 500 g | 30 g | 25 g PbO—$SiO_2$—$B_2O_3$ | 9.8 | 700 g | 20 g | 30° C. to 95° C. | 30° C. to 95° C. |
| Experimental Example 3 | 200 g | 500 g | 40 g | 25 g PbO—$SiO_2$—$B_2O_3$ | 10.5 | 700 g | 20 g | 30° C. to 95° C. | 30° C. to 95° C. |
| Experimental Example 4 | 200 g | 500 g | 50 g | 25 g PbO—$SiO_2$—$B_2O_3$ | 11 | 700 g | 20 g | 30° C. to 95° C. | 30° C. to 95° C. |

TABLE 2

Comparison of specific surface area of silver-coated glass frit between Experimental Examples 1 to 4

| | Experimental Example 1 | Experimental Example 2 | Experimental Example 3 | Experimental Example 4 |
|---|---|---|---|---|
| BET surface area ($m^2/g$) | 9.6893 | 8.7209 | 7.7024 | 7.8723 |

As shown in Experimental Examples 1 to 4 above, the pH of the first solution increased gradually depending on the amount of amine added, and the specific surface area decreased gradually as the pH increased. However, when the pH reached 11 (Experimental Example 4) or higher, the specific surface area increased again.

Through repeated experiments, it was found that the pH of the first solution is preferably adjusted to a pH of 10-11, more preferably a pH of 10.3-10.7, by controlling the amount of amine added to the first solution.

The silver-coated glass frit prepared in Experimental Example 3 above had a specific surface area greater than that of conventional silver (Ag) powder which is used in a silver paste for a solar cell, and for this reason, the specific surface area thereof needs to further be reduced.

Accordingly, in Experimental Example 5, the temperature of the second reaction that reacts the second solution with the first solution by stirring, among the conditions of Experimental Example 3, was reduced to a temperature of 5° C. to 20° C. to control the reduction rate of silver (Ag) by the reducing agent, thereby further reducing the specific surface area of the prepared silver-coated glass frit.

Table 3 below shows compares the components and their ratios used in Experimental Examples 3 and 5, and Table 4 below compares the results of measuring the specific surface areas of the silver-coated glass frits prepared in Experimental Examples 3 and 5.

Figure 1:
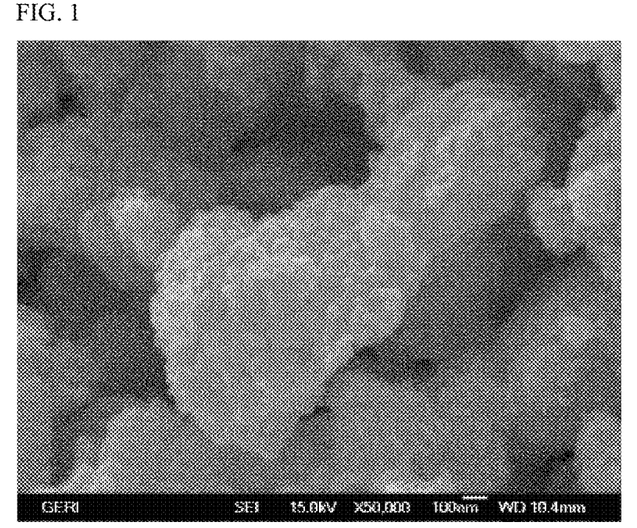
FIG. 1 is an image showing the shape of a silver-coated glass frit prepared in Experimental Example 1.
Figure 2:
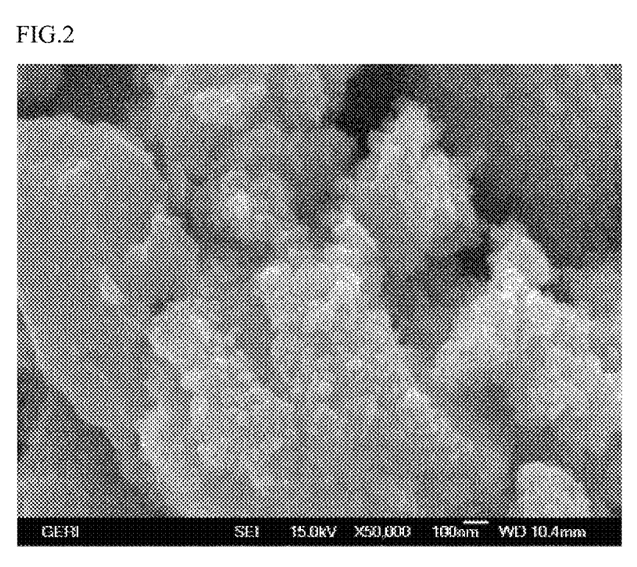
FIG. 2 is an image showing the shape of a silver-coated glass frit prepared in Experimental Example 2.
Figure 3:
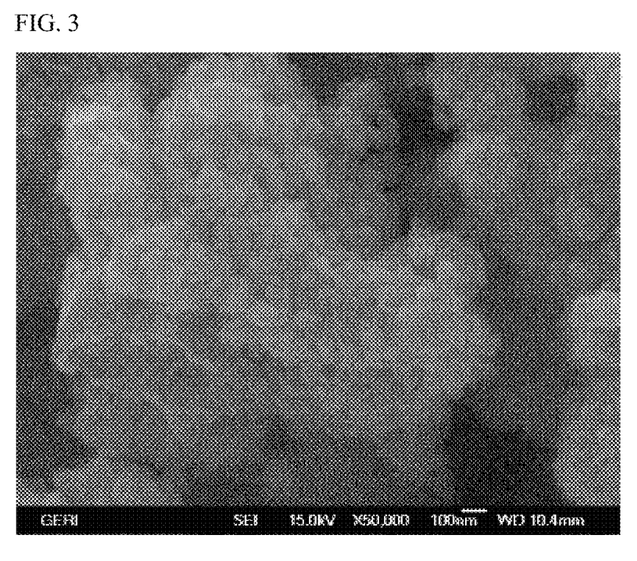
FIG. 3 is an image showing the shape of a silver-coated glass frit prepared in Experimental Example 3.
Figure 4:
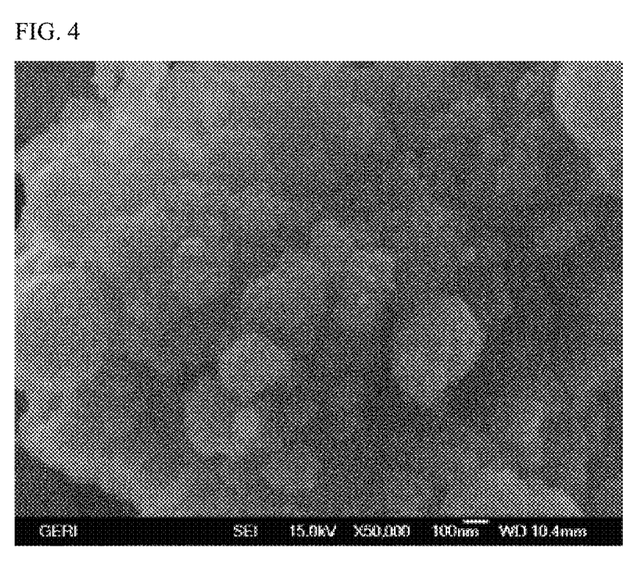
FIG. 4 is an image showing the shape of a silver-coated glass frit prepared in Experimental Example 4.
Figure 5:
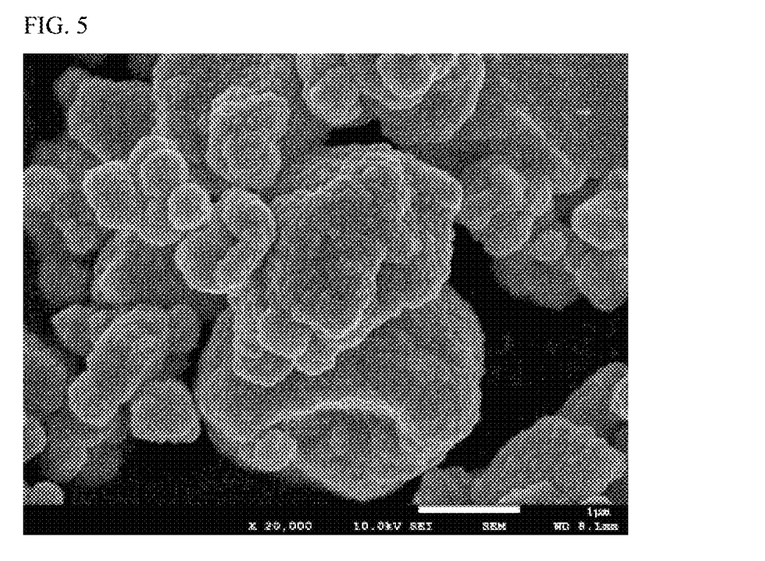
FIG. 5 is an image showing the shape of a silver-coated glass frit prepared in Experimental Example 5.

FIG. 5 is an image of the shape of the silver-coated glass frit prepared in Experimental Example 5. As can be seen therein, particles having a significantly reduced specific surface area compared to that of Experimental Example 3 (FIG. 3) can be observed.

TABLE 3

Comparison of components and their ratios between Experimental Examples 3 and 5

| | First solution | | | | | Second solution | | | |
|---|---|---|---|---|---|---|---|---|---|
| | Silver nitrate (AgNO$_3$) | Distilled water (H$_2$O) | Amine | Glass frit | pH | Distilled water (H$_2$O) | Reducing agent (ascorbic acid) | First reaction temperature | Second reaction temperature |
| Experimental Example 3 | 200 g | 500 g | 40 g | 25 g PbO—SiO$_2$—B$_2$O$_3$ | 10.5 | 700 g | 20 g | 30° C. to 95° C. | 30° C. to 95° C. |
| Experimental Example 5 | 200 g | 500 g | 40 g | 25 g PbO—SiO$_2$—B$_2$O$_3$ | 10.5 | 700 g | 20 g | 30° C. to 95° C. | 5° C. to 20° C. |

TABLE 4

Comparison of specific surface areas of silver-coated glass frit between Experimental Examples 3 and 5

| | Experimental Example 3 | Experimental Example 5 |
|---|---|---|
| BET surface area (m$^2$/g) | 7.7024 | 1.321 |

As shown in Experimental Examples 3 and 5, when the second reaction temperature was controlled to a relatively low temperature of 5° C. to 20° C., the specific surface area of the prepared silver-coated glass frit could be greatly be reduced.

In Experimental Examples 6 to 9, in order to examine the effect of a dispersing agent, a dispersing agent was added in an amounts of 0.15 g, 0.225 g, 0.3 g and 0.375 g in Experimental Examples 6 to 9, respectively, under the conditions of Experimental Example 5, and the particle size distribution of the silver-coated glass frit as a function of the amount of dispersing agent added was examined.

The dispersing agent used was BYK 184.

Table 5 below compares the components and their ratios used in Experimental Examples 6 to 9, and Table 6 below compares the particle size distribution between glass frit before coating and the silver-coated glass frits prepared in Experimental Examples 6 to 9. Specifically, Table 6 shows the distribution (span) values measured by a PSA (Particle Size Analyzer).

Herein, higher particle size distribution (span) values indicate broader particle size distributions, and lower particle size distribution (span) values indicate narrower particle size distributions.

The particle size distribution value can be calculated using Equation 1 below.

$$\text{Particle size distribution value (span value)} = (D90-D10)/D50 \quad \text{[Equation 1]}$$

where D10 is a particle size corresponding to 10% of the total particle size distribution;

D50 is a particle size corresponding to 50% of the total particle size distribution;

D90 is a particle size corresponding to 90% of the total particle size distribution.

TABLE 5

Comparison of components and their ratios between Experimental Examples 6 to 9

| | First solution | | | | | Second solution | | | |
|---|---|---|---|---|---|---|---|---|---|
| | Silver nitrate (AgNO$_3$) | Distilled water (H$_2$O) | Amine | Glass frit | Dispersing agent (BYK182) | Distilled water (H$_2$O) | Reducing agent (ascorbic acid) | First reaction temperature | Second reaction temperature |
| Experimental Example 6 | 200 g | 500 g | 40 g | 25 g PbO—SiO$_2$—B$_2$O$_3$ | 0.15 | 700 g | 20 g | 30° C. to 95° C. | 5° C. to 20° C. |
| Experimental Example 7 | 200 g | 500 g | 40 g | 25 g PbO—SiO$_2$—B$_2$O$_3$ | 0.225 | 700 g | 20 g | 30° C. to 95° C. | 5° C. to 20° C. |
| Experimental Example 8 | 200 g | 500 g | 40 g | 25 g PbO—SiO$_2$—B$_2$O$_3$ | 0.3 | 700 g | 20 g | 30° C. to 95° C. | 5° C. to 20° C. |
| Experimental Example 9 | 200 g | 500 g | 40 g | 25 g PbO—SiO$_2$—B$_2$O$_3$ | 0.375 | 700 g | 20 g | 30° C. to 95° C. | 5° C. to 20° C. |

TABLE 6

Comparison of particle size distribution between glass frit before coating and silver coated glass frits

| | Glass frit before coating | Experimental Example 6 | Experimental Example 7 | Experimental Example 8 | Experimental Example 9 |
|---|---|---|---|---|---|
| Particle size distribution value (span value) | 1.6 | 1.3 | 1.5 | 1.6 | 2.0 |

As shown in Experimental Examples 6 to 9, when the dispersing agent was added in amounts of 0.15 g and 0.225 g, the particle size distribution value was reduced compared to that of the glass frit before coating. However, as shown in Experimental Examples 8 and 9, the dispersing agent was added in an amount of 0.3 g or more, the particle size distribution value was similar to or higher than that of the glass frit before coating.

This indicates that the dispersing agent is effective when it is added in an amount of 0.1 to 1 wt % based on the content of the glass frit.

Meanwhile, in Experimental Example 5 above, the specific surface area of the silver-coated glass frit powder was reduced to a value close to 1 m2/g by controlling the pH of the first solution and performing the low-temperature stirring process. However, this specific surface area value was still somewhat higher than that of conventional silver (Ag) powder.

For this reason, in Experimental Examples 10 and 11, the silver-coated glass frit having a reduced particle size distribution, prepared in Experimental Example 6, was coated with a fatty acid, thereby further reducing the specific surface area.

Table 7 below shows the components and their ratios used in the fatty acid coating, and Table 8 below compares the specific surface area between the silver-coated glass frit powder before fatty acid coating and the silver-coated glass frit powders coated with fatty acid in Experimental Examples 10 and 11.

TABLE 7

Components and their ratios used in fatty acid coating

| | Third solution | | | Fourth solution | |
|---|---|---|---|---|---|
| | Oleic acid | Monoethanolamine | Ethanol | Deionized water | Silver-coated glass frit |
| Experimental Example 10 | 5 g | 5 g | 200 g | 200 g | 100 g |
| Experimental Example 11 | 10 g | 10 g | 200 g | 200 g | 100 g |

TABLE 8

Comparison of specific surface area between before and after fatty acid coating

| | BET surface area (m$^2$/g) |
|---|---|
| Silver-coated glass frit before fatty acid coating | 1.321 |
| Experimental Example 10 | 0.832 |
| Experimental Example 11 | 0.821 |

As shown in Experimental Examples 10 and 11 above, when fatty acid coating of the silver-coated glass frit was performed, the BET specific surface area of the silver-coated glass frit was reduced below 1 m2/g.

(3) Silver Paste Composition

A silver paste composition for a solar cell, comprising the silver-coated glass frit according to the present invention, comprises:

(i) silver (Ag) powder; (ii) silver-coated glass frit; (iii) glass frit; and (iv) an organic vehicle.

In the silver paste composition according to the present invention, (i) the content of silver (Ag) powder is 33 to 80 wt %; (ii) the content of silver-coated glass frit is 10 to 50 wt %; (iii) the content of glass frit is 1 to 5 wt %; and (iv) the content of the organic vehicle is 3 to 12 wt %. Preferably, (i) the content of silver (Ag) powder is 55 to 70 wt %; (ii) the content of silver-coated glass frit is 10 to 35 wt %; (iii) the content of glass frit is 1 to 3 wt %; and (iv) the content of the organic vehicle is 5 to 10 wt %.

The silver paste composition as described above may have an increased glass frit content by adding the silver-coated glass frit. Thus, it can improve the sintering characteristics of silver (Ag) particles, thereby minimizing the resistance of the electrode and making it possible to bring the solar cell electrode into uniform contact with the emitter layer. This can minimize the contact resistance between the solar cell electrode and the emitter layer, resulting in an increase in the efficiency of the solar cell. In addition, since the composition has an increased glass frit content, it can overcome the problem that the emitter layer of the solar cell is perforated by glass frit in a calcining process and thus the cell loses its function.

Furthermore, the content of silver (Ag) in the silver paste composition may be reduced, thereby reducing the production cost of the solar cell, resulting in an increase in the efficiency of production of the solar cell electrode.

In addition, the silver paste composition as described above has advantages in that the viscosity and flowability thereof are easily controlled, and thus it may be effectively applied for printing of a fine line-width in a paste printing process employing a screen printing method during solar cell fabrication.

The silver paste composition of the present invention may be obtained by mixing the above-described components using various methods known in the art such that these components are uniformly dispersed. For example, these components may be uniformly mixed using a 3-roll mill or the like, but the scope of the present invention is not limited thereto.

Hereinafter, the components of the silver paste composition will be described.

(i) Silver (Ag) Powder

The silver paste composition for the solar cell according to the present invention comprises silver (Ag) powder as conductive powder. This silver (Ag) powder may be powder having a nano-sized or micro-sized particle size. For example, the silver powder may be silver (Ag) powder having a size of several tens to several hundred nanometers or silver (Ag) powder having a size of a few to several tens of micrometers, and may also be a mixture of two or more silver (Ag) powders having different sizes.

The silver (Ag) powder may have a spherical, sheet-like or amorphous particle shape, may have a mean particle size (D50) of 0.1 μm to 10 μm, and may be contained in an amount of 33 to 80 wt % based on the total weight of the composition.

(ii) Silver-Coated Glass Frit

The silver paste composition for the solar cell according to the present invention comprises a silver-coated glass frit. This silver-coated glass frit comprises silver (Ag) coated on the surface of glass frit. The silver-coated glass frit has advantages in that glass frit having a low glass transition temperature facilitates melting of silver (Ag) coated on the surface of the glass frit in a calcining process performed for a short time, thereby improving the sintering characteristics of the silver (Ag) particles, thereby minimizing the series resistance of the electrode and the contact resistance between the electrode and the silicon wafer surface. At the same time, the melted glass frit is surrounded by silver (Ag) coated on the surface of the glass frit and does not flow out during the calcining process, thereby preventing a solar cell silicon wafer from being damaged by an increase in the content of glass frit.

In addition, when the silver-coated glass frit is added to the silver paste composition, there is an advantage in that the total silver (Ag) content of the silver paste composition can be reduced, and thus the amount of silver (Ag) used can be reduced, thereby reducing the production cost of a solar cell electrode.

The silver-coated glass frit may have a mean particle size (D50) of 1.0 to 1.5 μm; the mean thickness (D50) of the silver (Ag) coating layer formed on the glass frit in the silver-coated glass frit may be 0.2 to 0.7 μm; and the content of silver (Ag) coated formed on the glass frit in the silver-coated glass frit may be 30 to 60 wt %, preferably 40 to 50 wt %. In addition, the BET surface area (m2/g) of the silver-coated glass frit may be 0.8 m2/g to 0.9 m2/g after fatty acid coating.

(iii) Glass Frit

The glass serves to etch an anti-reflective layer in a calcining process for electrode formation. In addition, it facilitates melting of silver (Ag) particles in the calcining process to improve the sintering characteristics of the silver (Ag) particles, thereby minimizing the resistance of the electrode. At the same time, it makes it possible to bring the electrode in uniform contact with the electrode, thereby minimizing the contact resistance of the electrode and the emitter layer, resulting in an increase in the efficiency of the solar cell.

The glass frit that is used in the present invention may comprise any one or a mixture of two or more selected from among glass frits that are conventionally used in compositions for forming electrodes. In a specific example, the glass frit may be any one or a mixture of two or more selected from the group consisting of zinc oxide-silicon oxide (ZnO—SiO2), zinc oxide-boron oxide-silicon oxide (ZnO—B2O3-SiO2), zinc oxide-boron oxide-silicon oxide-aluminum oxide (ZnO—B2O2-SiO2-Al2O3), bismuth oxide (Bi2O3), bismuth oxide-silicon oxide (Bi2O3-SiO2), bismuth oxide-boron oxide-silicon oxide (Bi2O3-B2O3-SiO2), bismuth oxide-boron oxide-silicon oxide-aluminum oxide (Bi2O3-B2O3-SiO2-Al2O3), bismuth oxide-zinc oxide-boron oxide-silicon oxide (Bi2O3-ZnO—B2O3-SiO2), bismuth oxide-zinc oxide-boron oxide-silicon oxide-aluminum oxide (Bi2O3-ZnO—B2O3-SiO2-Al2O3), lead oxide (PbO), lead oxide-tellurium oxide (PbO—TeO2), lead oxide-tellurium oxide-silicon oxide (PbO—TeO2-SiO2), lead oxide-oxide tellurium-lithium oxide (PbO—TeO2-Li2O), bismuth oxide-tellurium oxide (Bi2O3-TeO2), bismuth oxide-tellurium oxide-silicon oxide (Bi2O3-TeO2-SiO2), bismuth oxide-tellurium oxide-lithium oxide (Bi2O3-TeO2-Li2O), tellurium oxide (TeO2), and oxide tellurium-zinc oxide (TeO2-ZnO) glass frits.

The glass frit may have a mean particle size (D50) of 0.1 to 10 μm. As the content of the glass frit increases, the contact area between the glass frit melted in the calcining process and a silicon wafer increases, and thus it etches the anti-reflective layer of the silicon wafer and also perforates the emitter layer formed under the anti-reflective layer, making the solar cell losing its function. Due to this problem, the content of the glass frit is preferably 5 wt % or less based on the total weight of the glass frit.

(iv) Organic Vehicle

The organic vehicle is mechanically mixed with the inorganic components of the silver paste composition for the solar cell, so that the composition may have viscosity and rheological properties suitable for printing.

The organic vehicle that is used in the present invention may be a conventional organic vehicle which is used in compositions for forming solar cell electrodes. It may comprise a binder resin and a solvent.

As the binder resin, acrylate or cellulose resin may be used, but ethyl cellulose is generally used. In addition, the binder resin may be selected from the group consisting of ethyl hydroxyethyl cellulose, nitrocellulose, a mixture of ethyl cellulose and phenol resin, alkyd resin, phenolic resin, acrylic ester resin, xylene resin, polybutene resin, polyester resin, urea resin, melamine resin, vinyl acetate resin, wood rosin, and polymethacrylate of alcohol.

For example, the solvent that is used in the present invention may be selected from the group consisting of hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methyl ethyl ketone, benzyl alcohol, gamma-butyrolactone, and ethyl lactate.

The organic vehicle that is used in the present invention may be 3 to 12 wt % based on the total weight of the composition. In this region, sufficient adhesive strength and excellent printability can be ensured.

Examples 1 to 3: Preparation of Silver Paste Compositions

In Examples 1 to 3, silver paste compositions for a solar cell were prepared using the silver-coated glass frit prepared in Experimental Example 11. Specifically, silver paste compositions were prepared using the components and contents shown in Table 9 below.

Here, the silver paste composition of the present invention may be obtained by mixing the above-described components using various methods known in the art such that these components are uniformly dispersed. For example, these components may be uniformly mixed using a 3-roll mill or the like, but the scope of the present invention is not limited thereto.

Comparative Example 1: Preparation of Silver Paste Composition According to Conventional Art In Comparative Example 1, a silver paste composition for forming a solar cell electrode according to a conventional art was prepared. Specifically, as shown in Table 9 below, a silver paste composition was prepared using the same components and contents as those used in Examples 1 to 3, except that the silver-coated glass frit was not used and the content of silver (Ag) powder was 90 g.

Test Example 1: Evaluation of Component Ratios and Physical Properties of Silver Paste Compositions The component ratios and physical properties of the silver paste compositions for a solar cell, prepared using the silver-coated glass frit in Examples 1 to 3 above, and the conventional silver paste composition for a solar cell, prepared in Comparative Example 1, were evaluated, and the results are shown in Table 9 below.

To evaluate the component ratios and physical properties of the silver paste compositions for a solar cell, prepared using the silver-coated glass frit in these Examples, and the conventional silver paste composition prepared in Comparative Example 1, the viscosities and T.I values of the silver paste compositions were adjusted to the same values in order to maintain the rheological properties thereof at the same levels, and in this state, the compositions were printed such that solar cell electrodes would have a line-width of 60 μm, and the series resistance (mΩ), fill factor and efficiency of the solar cells were measured.

TABLE 9

Results of evaluation of component ratios and physical properties of silver paste compositions

| | Silver paste composition | Silver paste compositions prepared using silver-coated glass grit | | |
|---|---|---|---|---|
| | Comparative Example 1 | Example 1 | Example 2 | Example 3 |
| Silver(Ag) powder (g) | 90 g | 80 g | 70 g | 60 g |
| Silver-coated glass frit (g) | 0 g | 10 g | 20 g | 30 g |
| Glass frit(Bi$_2$O$_3$—ZnO—Te$_2$) (g) | 1.5 g | 1.5 g | 1.5 g | 1.5 g |
| Organic vehicle (g) | 8.5 g | 8.5 g | 8.5 g | 8.5 g |
| Silver(Ag) content(wt %) | 90% | 85% | 80% | 75% |
| Series resistance (mΩ) | 4.684 | 4.355 | 4.263 | 5.268 |
| Efficiency (%) | 18.18 | 18.385 | 18.406 | 17.543 |
| Fill Factor | 76.93 | 77.82 | 77.85 | 74.05 |

As shown in Test Example 1 above, the silver paste compositions (Examples 1 and 2) for solar cells, prepared using the silver-coated glass frit according to the present invention, can exhibit a series resistance of 4.26 to 3.35, which is lower than that of the conventional silver paste composition (Comparative Example 1) for forming a solar cell electrode, which is composed mainly of silver (Ag) powder. This suggests that the use of the silver-coated glass frit can improve the sintering characteristics of silver (Ag) powder, thereby improving resistance and efficiency. Namely, it can be seen that in Examples 1 and 2 of the present invention, recrystallized silver (Ag) is stably formed, compared to that in Comparative Example 1, and thus the interfacial contact between the substrate and the electrode can be reduced, thereby improving the electrical properties of the solar cell.

In addition, compared to the conventional silver paste composition composed mainly of silver (Ag), the composition of the present invention, which contains a relatively small amount of silver (Ag), shows higher Fill Factor values and efficiency. This suggest that the characteristic of contact of the composition with the silicon wafer can be improved and the composition can improve the efficiency of the solar cell. In addition, the silver-coated glass frit can substitute for a portion of silver (Ag) powder forming the majority of a silver paste composition for forming a solar cell, and thus inhibit the increase in production cost by the use of expensive silver (Ag), thereby increasing the efficiency of the solar cell electrode. In addition, as shown in Table 9 above, although the fill factor and efficiency of the composition of Example 3 according to the present invention are somewhat lower than those of the conventional silver paste composition (Comparative Example 1), the composition of Example 3 has physical properties similar to those of the conventional silver paste composition for forming a solar cell electrode, while it has a significantly decreased content of silver (Ag). Thus, the composition of the present invention has an advantage in that it can significantly reduce the content of silver compared to that the content of silver in the conventional silver paste composition for forming a solar cell electrode.

Namely, it can be seen that the silver paste composition according to the present invention shows similar or improved characteristics compared to those of the conventional silver paste composition for forming the solar cell, while it has a reduced silver (Ag) content.

Example 4: Preparation of Silver Paste Composition

In this Example, a silver paste composition for a solar cell was prepared using the silver-coated glass frit prepared in Experimental Example 11. Specifically, a silver paste composition was prepared using the components and contents shown in Table 10 below.

Here, the silver paste composition of the present invention may be obtained by mixing the above-described components using various methods known in the art such that these components are uniformly dispersed. For example, these components may be uniformly mixed using a 3-roll mill or the like, but the scope of the present invention is not limited thereto.

Comparative Example 2: Preparation of Silver Paste Composition

In Comparative Example 2, a silver paste composition for forming a solar cell electrode according to a conventional art was prepared. Specifically, as shown in Table 10 below, a silver paste composition comprising 90% silver (Ag) powder, 5% glass frit and 5% organic vehicle was prepared without using the silver-coated glass frit.

Meanwhile, the silver paste composition prepared according to the Example of the present invention consisted of 60% (Ag) powder, 5% glass frit, 35% silver-coated glass frit and 5% organic vehicle.

Test Example 2: Evaluation of Viscosities and T.I Values According to Component Ratios of Silver Paste Compositions The viscosities and T.I values according to component ratios of the silver paste composition for a solar cell, prepared using the silver-coated glass frit in Example 4, and the conventional silver paste composition for a solar cell, prepared in Comparative Example 2, were evaluated, and the results are shown in Table 10 below.

TABLE 10

Results of evaluation of viscosities and T.I values according to component ratios of silver paste compositions

|  | Conventional silver paste composition (Comparative Example 2) | Silver paste composition prepared using silver-coated glass frit (Example 4) |
| --- | --- | --- |
| Silver (Ag) powder | 90% | 60% |
| Glass frit | 5% | 5% |
| Silver-coated glass frit | — | 35% |
| Organic vehicle | 5% | 5% |
| Viscosity | 382.000 | 401.000 |
| T.I (rheology) | 3.8 | 4.0 |

As shown in Test Example 2, the viscosity and T.I value of the silver paste composition prepared using the silver-coated glass frit according to Example 4 are similar to those of the conventional silver paste composition for forming a solar cell electrode.

Test Example 3: Fine Line-Width Printing with Silver Paste Composition

Figure 6:
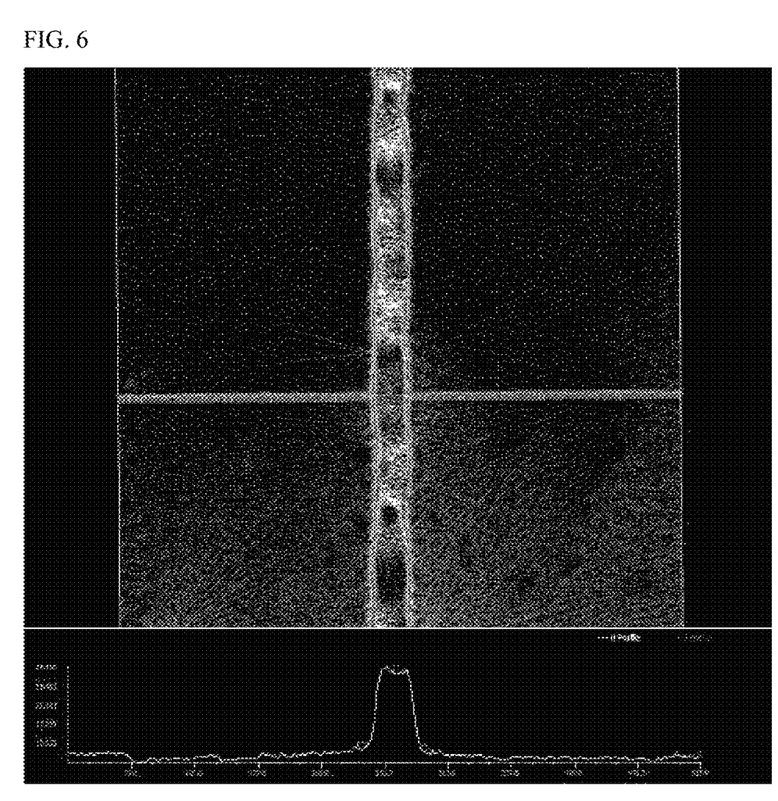
FIG. 6 is an image showing a fine line-width printed using a conventional silver paste composition for forming a solar cell electrode, prepared in Comparative Example 2.
Figure 7:
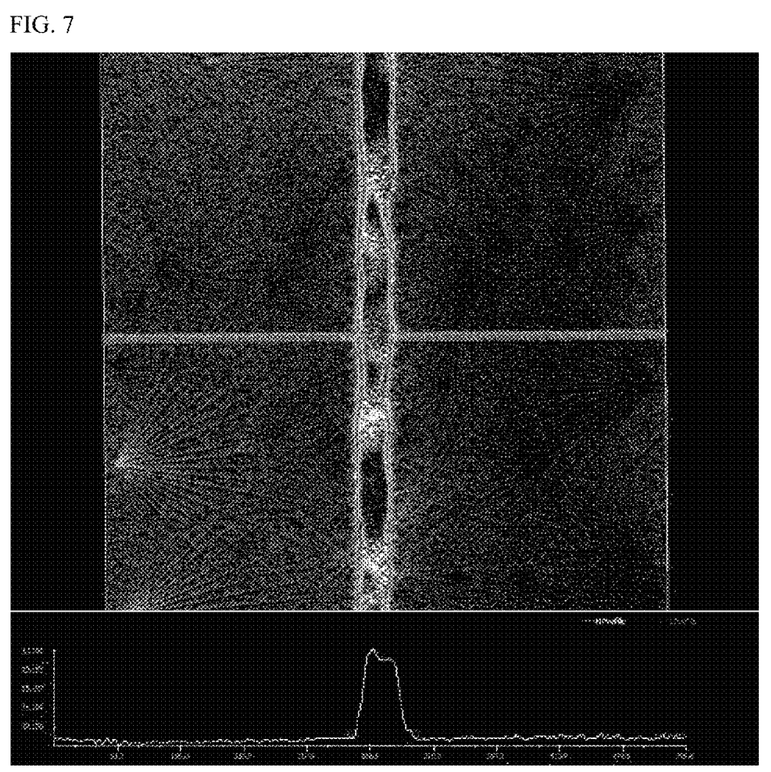
FIG. 7 is an image showing a fine line-width printed using a conventional silver paste composition for a solar cell, prepared in Example 4 and comprising a silver-coated glass frit.

Using the silver paste composition for the solar cell, prepared using the silver-coated glass frit according to Example 4, and the conventional silver paste composition for forming the solar cell electrode, prepared in Comparative Example 2, fine line-width printing was performed. The results of the fine line-width printing are shown in Table 11 below. FIG. 6 is an image showing the result of fine line-width printing with the conventional silver paste composition prepared according to Comparative Example, and FIG. 7 is an image showing the result of fine line-width printing with the silver paste composition prepared using the silver-coated glass frit according to Example 4 of the present invention.

TABLE 11

Fine line-width printing with silver paste compositions

|  | Conventional silver paste composition | Silver paste composition prepared using silver-coated glass frit |
| --- | --- | --- |
| Fine line-width printed | 43.5 gm | 44.7 gm |

As can be seen in Test Example 3 above, the silver paste composition prepared using the silver-coated glass frit according to Example 4 of the present invention can provide a printed fine line-width equal to that provided by the conventional silver paste composition of Comparative Example 2, which is composed mainly of silver (Ag) powder.

As described above, the present invention provides a silver-coated glass frit, a preparation method thereof, and a silver paste composition for a solar cell, which comprises the silver-coated glass frit. According to the present invention, a silver-coated glass frit comprising a uniform silver (Ag) coating layer formed thereon is prepared by a simple process using a wet reduction process. When the silver-coated glass frit prepared as described above is applied to a silver paste composition, glass frit having a low glass transition temperature facilitates melting of silver (Ag) coated on the surface of the glass frit in a calcining process performed for a short time, thereby improving the sintering characteristics of the silver (Ag) particles. At the same time, the glass frit melted during the calcining process is surrounded by silver (Ag) coated on the surface of the glass frit and does not flow out, thereby preventing a solar cell silicon wafer from being damaged by an increase in the content of glass frit.

In addition, a silver paste composition for a solar cell, which comprises the silver-coated glass frit, solves the problem that the emitter layer of the solar cell is perforated by glass frit and thus the cell loses its function, while the composition has an increased content of glass frit. Thus, the content of silver (Ag) in the silver paste composition can be reduced, thus reducing the production cost of the solar cell. In addition, even when the composition contains a small amount of silver (Ag), it can minimize the resistance of the electrode due to its improved sintering characteristics, and makes it possible bring the electrode into uniform contact with the emitter layer, thereby reducing the contact resistance between the electrode and the emitter layer, resulting in improvement in the efficiency of the solar cell electrode.

In addition, according to the present invention, the silver-coated glass frit comprising silver (Ag) coated on the surface of glass frit is prepared by adding a solution containing a reducing agent to a solution comprising a mixture of silver nitrate (AgNO3), glass frit and amine. In the preparation process, the pH of the solution and the reaction temperature are adjusted to control the rate of the reduction reaction, thereby forming a uniform silver (Ag) coating layer on the surface of the glass grit. Thus, the prepared silver-coated glass frit may have a reduced specific surface area. This silver paste composition comprising the silver-coated glass frit has advantages in that the viscosity and flowability in a calcining process are easily controlled and it is effectively applied for fine line-width printing in a paste printing process employing a screen printing method during solar cell fabrication.

While the configuration, Experimental Examples and Examples of the present invention has been described above, these illustrate preferred experimental examples and examples of the present invention, and the scope of the present invention is not limited thereto and is defined by the appended claims. In addition, any person skilled in the art will appreciate that various modifications are possible without departing from the scope of the present invention as defined in the appended claims. Thus, these modifications or improvements fall within the scope of the present invention, as long as the scope thereof is obvious to those skilled in the art.

INDUSTRIAL APPLICABILITY

According to a method for preparing a silver-coated glass frit in accordance with the present invention, a silver-coated glass frit comprising a uniform silver (Ag) coating layer coated on the surface of glass grit having a relatively low glass transition temperature (Tg) is prepared through a simple process of adding a solution containing a reducing agent to a solution comprising a mixture of silver nitrate (AgNO3), glass frit and amine. When a silver paste composition for a solar cell is prepared using the silver-coated glass frit prepared as described above, the glass frit having a low glass transition temperature can facilitate melting of silver (Ag) coated on the glass frit even in a calcining process performed for a relatively short time. This can improve the sintering characteristics of the silver (Ag) particles, and also improve the contact between the silver particles and a substrate, thereby reducing the contact resistance between the substrate and the electrode, resulting in significant improvement in the electrical properties of the solar cell.

The invention claimed is:

1. A method for preparing a silver-coated glass frit for forming a solar cell electrode, the method comprising the steps of:
   (a) preparing a first solution by adding glass frit, amine and a dispersing agent to a silver nitrate solution made by dissolving silver nitrate (AgNO3) in distilled water, followed by stirring;
   (b) dissolving a reducing agent for precipitating silver (Ag) from silver nitrate in distilled water, thereby preparing a second solution;
   (c) adding the second solution to the first solution, followed by stirring; and
   (d) collecting, washing and drying a silver-coated glass frit having a silver (Ag) coating layer formed on a surface of the glass frit in step (c).

2. The method of claim 1, wherein a concentration of the silver nitrate in the first solution is 1 to 4 M (molarity, mol/l);
   a concentration of the amine in the first solution is 0.1 to 1 M;
   a concentration of the glass frit in the first solution is 0.5 to 2 M; and
   a concentration of the reducing agent in the second solution is 0.02 M to 1 M.

3. The method of claim 1, wherein a dispersing agent is added to the first solution in an amount of 0.1 to 1 wt % based on the weight of the glass frit.

4. The method of claim 1, wherein the glass frit added to the first solution has a mean particle size (D50) of 0.3 to 1.3 μm.

5. The method of claim 1, wherein the stirring in step (a) of preparing the first solution is performed at 200 to 700 rpm and at a temperature of 30° C. to 95° C.

6. The method of claim 1, wherein the first solution is maintained at a pH of 10 to 11.

7. The method of claim 1, wherein step (c) of adding the second solution to the first solution, followed by stirring, comprises stirring at 200 to 700 rpm and at a temperature of 5° C. to 20° C. while adding the second solution to the first solution at an injection rate of 5 to 50 g/min.

8. The method of claim 1, further comprising, after step (d), the steps of:
   (e) stirring oleic acid, monoethanolamine and ethanol, thereby preparing a third solution;
   (f) adding the silver-coated glass frit obtained in step (d) to distilled water, followed by stirring, thereby preparing a fourth solution;
   (g) adding the third solution to the fourth solution in an amount corresponding to 5 wt % to 20 wt % of the weight of the added silver-coated glass frit, followed by stirring; and
   (h) collecting, washing and drying the silver-coated glass frit resulting from step (g).

9. The method of claim 1, wherein the reducing agent comprises any one or a mixture of two or more selected from the group consisting of hydrazine, hydroquinone, ascorbic acid, aldehyde, and glucose.

10. The method of claim 1, wherein the amine comprises any one or a mixture of two or more selected from the group consisting of aliphatic primary amines, aliphatic secondary amines, aliphatic tertiary amines, aliphatic unsaturated amines, aliphatic cyclic amines, and aromatic amines.

11. The method of claim 1, wherein the glass frit comprises any one or a mixture of two or more selected from the group consisting of zinc oxide-silicon oxide ($ZnO$—$SiO_2$), zinc oxide-boron oxide-silicon oxide ($ZnO$—$B_2O_3$—$SiO_2$), zinc oxide-boron oxide-silicon oxide-aluminum oxide ($ZnO$—$B_2O_3$—$SiO_2$—$Al_2O_3$), bismuth oxide ($Bi_2O_3$), bismuth oxide-silicon oxide ($Bi_2O_3$—$SiO_2$), bismuth oxide-boron oxide-silicon oxide ($Bi_2O_3$—$B_2O_3$—$SiO_2$), bismuth oxide-boron oxide-silicon oxide-aluminum oxide ($Bi_2O_3$—$B_2O_3$—$SiO_2$—$Al_2O_3$), bismuth oxide-zinc oxide-boron oxide-silicon oxide ($Bi_2O_3$—$ZnO$—$B_2O_3$—$SiO_2$), bismuth oxide-zinc oxide-boron oxide-silicon oxide-aluminum oxide ($Bi_2O_3$—$ZnO$—$B_2O_3$—$SiO_2$—$Al_2O_3$), lead oxide (PbO), lead oxide-tellurium oxide ($PbO$—$TeO_2$), lead oxide-tellurium oxide-silicon oxide ($PbO$—$TeO_2$—$SiO_2$), lead oxide tellurium-lithium oxide ($PbO$—$TeO_2$—$Li_2O$), bismuth oxide-tellurium oxide ($Bi_2O_3$—$TeO_2$), bismuth oxide-tellurium oxide-silicon oxide ($Bi_2O_3$—$TeO_2$—$SiO_2$), bismuth oxide-tellurium oxide-lithium oxide ($Bi_2O_3$—$TeO_2$—$Li_2O$), tellurium oxide ($TeO_2$), and oxide tellurium-zinc oxide ($TeO_2$—$ZnO$) glass frits.

12. The method of claim 1, wherein the dispersing agent is an anionic or nonionic aqueous dispersing agent.

* * * * *